United States Patent
Kim et al.

(10) Patent No.: US 7,145,140 B2
(45) Date of Patent: Dec. 5, 2006

(54) METHOD OF DETERMINING WHETHER A CONDUCTIVE LAYER OF A SEMICONDUCTOR DEVICE IS EXPOSED THROUGH A CONTACT HOLD

(75) Inventors: Ji-soo Kim, Seongnam (KR); Wan-jae Park, Suwon (KR); Kyoung-sub Shin, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/673,581

(22) Filed: Sep. 30, 2003

(65) Prior Publication Data

US 2004/0061052 A1    Apr. 1, 2004

Related U.S. Application Data

(63) Continuation of application No. 09/640,088, filed on Aug. 17, 2000, now Pat. No. 6,657,192.

(30) Foreign Application Priority Data

Aug. 17, 1999   (KR) ............................... 1999-33858

(51) Int. Cl.
    *G01N 23/225*   (2006.01)
(52) U.S. Cl. ..................... 250/307; 250/310; 324/751
(58) Field of Classification Search ................ 250/310, 250/311; 324/751
    See application file for complete search history.

(56) References Cited

U.S. PATENT DOCUMENTS

| | | | |
|---|---|---|---|
| 4,745,360 A * | 5/1988 | Reimer et al. ............ | 324/751 |
| 4,904,902 A | 2/1990 | Tamai et al. | |
| 5,334,846 A | 8/1994 | Nakano et al. | |
| 5,434,423 A | 7/1995 | Phan | |
| 5,523,694 A | 6/1996 | Cole, Jr. | |
| 5,594,245 A * | 1/1997 | Todokoro et al. ........... | 250/310 |
| 5,817,533 A | 10/1998 | Sen et al. | |
| 6,066,849 A * | 5/2000 | Masnaghetti et al. ....... | 250/310 |
| 6,091,249 A * | 7/2000 | Talbot et al. ................ | 324/751 |
| 6,204,075 B1 | 3/2001 | Kikuchi | |
| 6,232,787 B1 * | 5/2001 | Lo et al. ..................... | 324/751 |
| 6,618,850 B1 * | 9/2003 | Nishiyama et al. ........... | 716/20 |
| 6,657,192 B1 * | 12/2003 | Kim et al. .................. | 250/310 |

FOREIGN PATENT DOCUMENTS

| | | |
|---|---|---|
| JP | 62-193352 | 8/1986 |
| JP | 8-111397 | 4/1996 |

* cited by examiner

Primary Examiner—Jack I. Berman
(74) Attorney, Agent, or Firm—Volentine Francos & Whitt

(57) ABSTRACT

In a method for determining the degree of charge-up induced by plasma used for manufacturing a semiconductor device and an apparatus therefor, a predetermined region on a surface of a wafer on which a plasma process has been performed is repeatedly scanned with a primary electron beam. Secondary electrons generated by a reaction between the primary electron beam and the surface of the wafer that are emitted to the outside of the surface of the wafer are collected. The degree of charge-up induced at the surface of the wafer by the plasma used during the plasma process is determined from the change in the amount of collected secondary electrons. Determination as to whether a contact hole is opened or as to the degree of degradation of a gate insulating layer is made based on the degree of charge-up.

8 Claims, 10 Drawing Sheets

METHOD OF DETERMINING WHETHER A CONDUCTIVE LAYER OF A SEMICONDUCTOR DEVICE IS EXPOSED THROUGH A CONTACT HOLD

CROSS REFERENCES TO RELATED APPLICATIONS

This application is a continuation of U.S. patent application Ser. No. 09/640,088 filed on 17 Aug. 2000, now U.S. Pat. No. 6,657,192 and claims priority under 35 U.S.C. 119 to Korean Application No. 99-33858 filed on 17 Aug. 1999, the entirety of each of which is hereby incorporated by reference in its entirety for all purposes.

The present application claims priority under 35 U.S.C. 119 to Korean Application No. 99-33858 filed on Aug. 17, 1999, which is hereby incorporated by reference in its entirety for all purposes.

BACKGROUND OF THE INVENTION

1. Field of the Invention

The present invention is related to the manufacture of semiconductor devices, and more particularly, to a method of determining the degree of charge-up induced by plasma according to a plasma process, a method for determining whether a contact hole is open using the same, a method for determining the degree of degradation of a gate insulating layer induced by plasma, and an apparatus therefor.

2. Description of the Related Art

A process of using plasma to etch a material layer is used in manufacturing semiconductor devices. For example, in a process of forming a contact hole which exposes a material layer under an insulating layer by etching the insulating layer, the insulating layer is patterned using plasma as an etching medium. At this time, charge separation may occur in an insulating layer pattern due to the electrical characteristic of the plasma. Ions accumulate inside the contact hole of the insulating layer pattern, that is, on the bottom of the contact hole due to charge separation. This so called charge-up can cause various defects in semiconductor devices. For example, when a contact hole exposing a gate electrode is formed, charge-up caused by the plasma process may degrade a gate insulating layer under the gate electrode.

For example, FIG. 1 schematically shows the distribution of charges which are charged up when a contact hole 45 is formed by a plasma process. The degradation of a gate insulating layer 20 caused by the plasma process is described in detail as follows. During formation of contact hole 45 by a plasma process, charge separation may occur at the bottom and top of the contact hole 45. That is, almost all ions of the plasma which are accelerated by a sheath travel in a straight direction, thus accumulating at the bottom of the contact hole 45 as ions 50. Meanwhile, electrons of the plasma accumulate at the upper portion of the contact hole 45 as electrons 55 due to isotropic angular momentum distribution of electrons. This means that the (−) charges are charged up in the upper portion of the contact hole 45 and the (+) charges are charged up on the bottom portion of the contact hole 45. Such a charge-up phenomenon can occur in a plasma etching process for forming a trench or a line and a space structure, as well as in a process of forming a contact hole such as contact hole 45.

Ions 50 which are accumulated at the bottom of the contact hole 45, the trench or line, or the space structure due to charge separation can have the effect that a positive voltage is applied on the gate electrode 30. This positive voltage can affect the gate insulating layer 20. Charge-up of the gate insulating layer 20 continues while the plasma process continues and charges which are charged up due to charge separation reside after the plasma process is terminated. Accordingly, the effect of applying the positive voltage to the gate insulating layer 20 is maintained. The gate insulating layer 20 may be damaged by charge-up thereof, that is, the effect of continuously applying the positive voltage may degrade gate insulating layer 20. Incidentally, when the plasma process is performed, the charge-up phenomenon caused by the plasma cannot be avoided. Also, it is not possible to prevent the material layer such as the gate insulating layer 20 from being degraded or damaged by the charge-up phenomenon.

Additionally, high integration of semiconductor devices due to a reduction in the design rule results in an increase in the aspect ratio of contact hole 45, for example. Accordingly, the line width of the bottom of the contact hole 45 is reduced and the height of the insulating layer pattern 40 is relatively increased. This makes the degree of charge-up induced by the plasma to the insulating layer pattern 40 severe. Therefore, degradation of the gate insulating layer 20 due to charge-up induced by the plasma becomes severe.

It is thus necessary to measure the degree of charge-up due to a plasma process in order to minimize or prevent damage to or degradation of the gate insulating layer caused by the plasma. A plasma damage monitoring (PDM) method has recently been used for measuring the degree of charge-up induced by the plasma. In the PDM method, the degree of damage to the gate insulating layer caused by the plasma is measured based on a change in capacitance of a wafer including the gate insulating layer. However, since the PDM method has limitations with respect to spatial resolution and calibration, the PDM method is used for measuring the degree of charge-up with respect to a flat material layer. Therefore, the PDM method has limitations in connection with measuring the degree of charge-up with respect to a wafer on which patterns are formed.

SUMMARY OF THE INVENTION

The present invention is therefore directed to an apparatus and method for determining charge-up induced by plasma or the degree of charge-up with respect to a wafer on which patterns are formed, which substantially overcomes one or more of the problems due to the limitations and disadvantages of the related art.

It is therefore an object of the present invention to provide an apparatus for determining charge-up induced by plasma or the degree of charge-up with respect to a wafer on which patterns are formed.

It is another object of the present invention to provide a method of determining charge-up induced by plasma or the degree of charge-up with respect to a wafer on which patterns are formed.

It is another object of the present invention to provide a method for determining whether a contact hole is opened.

It is another object of the present invention to provide a method of determining the degree of degradation of a gate insulating layer caused by charge-up induced by a plasma process used to form an insulating layer pattern, the insulating layer pattern having a contact hole which exposes a gate electrode and wherein the gate insulating layer is formed under the gate electrode.

Accordingly, to achieve the first object, there is provided an apparatus for determining the degree of charge-up induced by plasma used for manufacturing a semiconductor device, comprising a wafer on which a plasma process is performed, an electron beam generator for generating a beam of primary electrons for repeatedly scanning a predetermined region of the wafer, a detector installed on the surface of the wafer to be separated from the wafer by a predetermined distance, the detector for collecting secondary electrons generated by the reaction between the primary electron beam and the surface of the wafer and emitted to the outside of the surface of the wafer, and a determination unit for determining the degree of charge-up induced to the surface of the wafer by plasma used for the plasma process from the change in the amount of secondary electrons collected by the detector.

To achieve the second object, in a method for determining the degree of charge-up induced by plasma used for manufacturing a semiconductor device, a wafer, on which a plasma process is performed, is introduced. Secondary electrons generated by a reaction between a primary electron beam and the surface of the wafer that are emitted to the outside of the surface of the wafer are collected by repeatedly scanning the primary electron beam on a predetermined region of the surface of the wafer. The degree of charge-up induced at the surface of the wafer by the plasma used for the plasma process is determined from the change in the amount of collected secondary electrons.

The step of determining the degree of charge-up can be performed as follows. Namely, a sample graph, which shows the change in the amount of collected secondary electrons with respect to the number of scans of primary electrons, is provided. A reference graph, which shows the change in the amount of secondary electrons detected in a standard state where charge-up induced by primary electrons is removed with respect to the number of scans of primary electrons, is provided. The degree of charge-up is determined by comparing the waveform of the sample graph to the waveform of the reference graph.

The number of scans corresponding to the maximum peak point of the sample graph is compared to the number of scans corresponding the maximum peak point of the reference graph and the degree of charge-up is quantized from the degree to which the number of scans of the sample graph is larger than the number of scans of the reference graph in the step of determining the degree of charge-up.

Alternatively, the maximum peak value of the sample graph is compared with the maximum peak value of the reference graph and the degree of charge-up is quantized from the degree to which the maximum peak value of the sample graph is smaller than the maximum peak value of the reference graph, in the step of determining the degree of charge-up.

To achieve the third object, the step of determining whether the contact hole exposes the surface of the conductive layer can be performed as follows. A sample graph, which shows the change in the amount of collected secondary electrons with respect to the number of scans of primary electrons, is provided. A reference graph, which shows the change in the amount of secondary electrons detected in a standard state where the contact hole is opened with respect to the number of scans of primary electrons, is provided. Whether the contact hole is opened is determined by comparing the waveform of the sample graph to the waveform of the reference graph.

In the step of determining whether the contact hole is opened, it is considered that the contact hole is opened when the waveform of the sample graph overlaps the waveform of the reference graph and it is considered that the contact hole is not opened when the waveform of the sample graph is separated from the waveform of the reference graph, or in other words when the sample graph does not overlap on the reference graph. It is determined that the contact hole is not opened when the waveform of the sample graph is separated from the waveform of the reference graph toward, an upper direction when the number of scans is no more than 200.

To achieve the fourth object, in a method for determining the degree of degradation of the insulating layer of a semiconductor device after a plasma process, a wafer, which has a gate insulating layer formed under a material layer on which the plasma process is performed, is introduced. A beam of primary electrons are repeatedly scanned on a predetermined region of the material layer and secondary electrons generated by a reaction between the primary electron beams and the surface of the material layer that are emitted to the outside of the material layer are collected. The degree to which the gate insulating layer is degraded by the plasma process is determined from the change in the amount of collected secondary electrons.

The step of determining the degree of degradation of the gate insulating layer can be performed as follows. A sample graph, which shows the change in the amount of collected secondary electrons with respect to the number of scans of primary electrons, is provided. A reference graph, which shows the change in the amount of secondary electrons detected in a standard state where the gate insulating layer is not degraded with respect to the number of scans of primary electrons, is provided. The degree of degradation of the gate insulating layer is determined by comparing the waveform of the reference graph to the waveform of the sample graph.

The number of scans corresponding to the maximum peak point of the sample graph is compared with the number of scans corresponding to the maximum peak point of the reference graph and the degree of degradation of the gate insulating layer is quantized from the degree to which the number of scans of the sample graph is larger than the number of scans of the reference graph, in the step of determining the degree of degradation of the gate insulating layer.

Alternatively, the degree of degradation of the gate insulating layer is quantized from the degree to which the maximum peak value of the sample graph is smaller than the maximum peak value of the reference graph by comparing the maximum peak value of the sample graph to the maximum peak value of the reference graph, in the step of determining the degree of degradation of the gate insulating layer.

The degree of degradation of the gate insulating layer may also be quantized from the degree to which the number of scans of the reference graph is smaller than the number of scans of the reference graph by comparing the number of scans where the peak value of the sample graph is reduced to 0 with the number of scans where the peak value of the reference graph is reduced to 0, in the step of determining the degree of degradation of the gate insulating layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
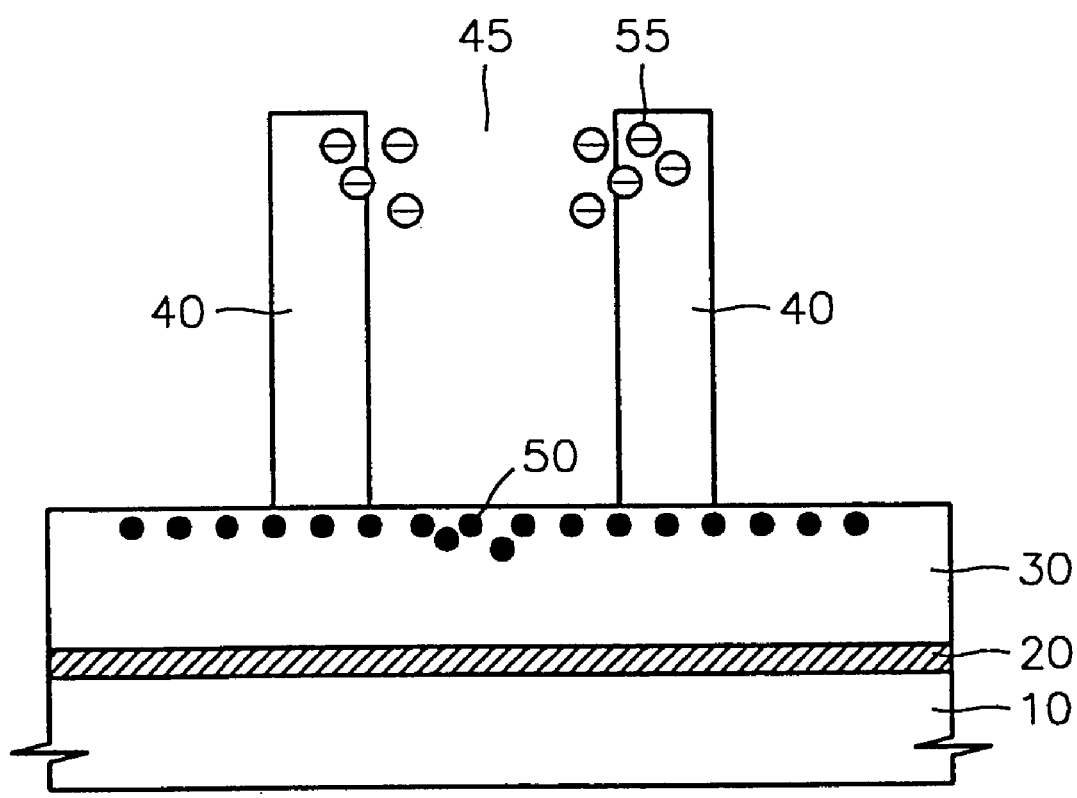
FIG. 1 schematically shows the distribution of charges which are charged up when a contact hole is formed by a plasma process.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same element, and thus their description will be omitted.

In the present embodiment, a phenomenon in which the amount of secondary electrons generated by the scanning of a primary electron beam on the surface of the wafer is changed by the degree of charge-up, is mainly used in order to measure the degree of charge-up induced by plasma. To be more specific, primary electrons which scan the surface of a wafer generate secondary electrons by reacting with the surface of the wafer or the surface of a material layer formed on the surface of the wafer. Since generated secondary electrons are emitted from the surface of the wafer, it is possible to detect secondary electrons and to show the amounts of detected secondary electrons according to the number of scans of the primary electron beam.

At this time, since some secondary electrons may be trapped by a potential well formed by charged ions, the amount of detected secondary electrons actually varies according to the amount of charged ions. It is possible to measure the amount of charged ions from the amount of detected secondary electrons. Thus, it is possible to measure the degree of charge-up induced by the plasma. The present invention will be described in more detail in accordance with the following embodiments.

Figure 2:
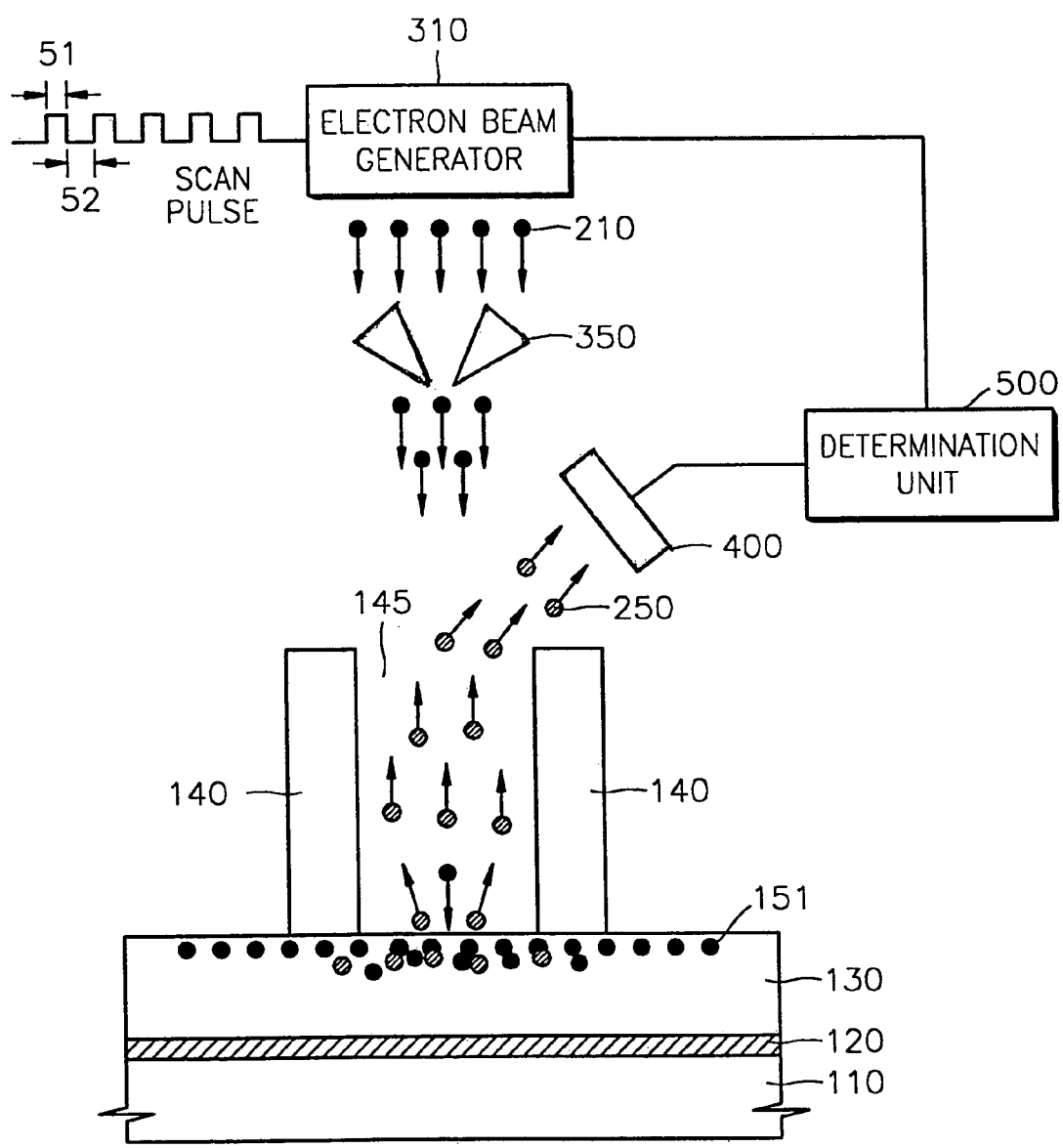
FIG. 2 schematically shows an apparatus for measuring the degree of charge-up induced by plasma according to a first embodiment of the present invention.
Figure 3:
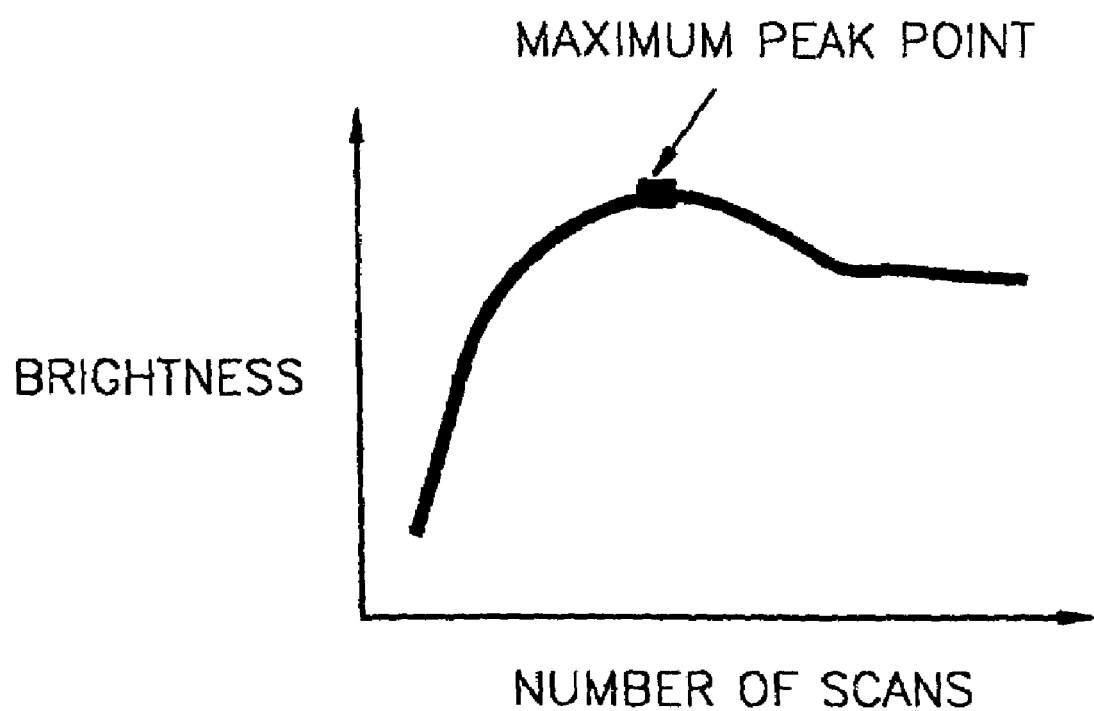
FIG. 3 shows the change in the amount of secondary electrons measured by the apparatus of FIG. 2 as brightness according to the number of scans of the primary electron beam.

FIG. 2 shows an apparatus for measuring the degree of charge-up induced by plasma according to a first embodiment of the present invention. FIG. 3 shows the change in the amount of secondary electrons measured by the apparatus of FIG. 2 as brightness according to the number of scans of first electron beam.

Referring to FIG. 2, a measuring apparatus according to a first embodiment of the present invention includes an electron beam generator 310 for generating primary electrons 210 and scanning the surface of a wafer 110 and a detector 400 for collecting and detecting emitted secondary electrons 250. The primary electrons 210 repeatedly scan a certain region on the wafer 110. Namely, scans are repeatedly performed on the same region. As a result, the primary electrons 210 are irradiated in the form of scan pulses. Accordingly, the number of scans can be sequentially counted.

Although not shown, electron beam generator 310 includes a light source such as an electron gun, a condenser lens for condensing the electron beam generated by the light source, and a scanning coil for changing the direction of the electron beam so that the electron beam scans the surface of the wafer. The electron beam can be scanned on a certain region of the wafer 110 by the control of current applied to the scanning coil. The electron beam is controlled to have an appropriate size by an object lens unit 350 that includes an object lens for controlling the focus and an object lens aperture attached to the object lens. Transmission of the electron beam 210 is controlled by the applied scan pulse consisting of positive and negative pulse widths 51 and 52.

The beam of the primary electrons 210 which scans the wafer 110 scans the inside of a contact hole 145 including insulating layer patterns 140 formed on the wafer 110. At this time, the incident primary electrons 210 react with the material layer such as gate electrode 130 which is the bottom of the contact hole 145, thus generating the secondary electrons 250.

The insulating layer patterns 140 formed on the wafer 110 are patterned by a plasma process, for example an etching process where plasma is used as an etching medium. In a plasma process, it is possible to induce charge-up of the resultant structure formed by the plasma patterning process. To be more specific, a charge separation phenomenon occurs where electrons 55 accumulate at the upper portion of a contact hole 45 and the ions (50 of FIG. 1 and 151 of FIG. 2) accumulate at the bottom of the contact hole 45, for example in the gate electrode (30 of FIG. 1 and 130 of FIG. 2), as shown in FIG. 1. The surface of the material layer such as the gate electrode 130 which is the bottom of the contact hole (145 of FIG. 2) is charged up by ions 151.

The charged ions 151 form an electric field around the bottom of the contact hole 145. Some of the secondary electrons 250 generated by the primary electrons 210 used for scanning can be trapped by a potential well formed by the electric field. Also, charge recombination can occur between the generated secondary electrons 250 and the accumulated ions 151. Therefore, a considerable amount of electrons among the secondary electrons 250 generated in the contact hole 145 by the primary electrons 210 used for scanning are not emitted to the outside of the contact hole 145 due to trapping by the potential well and charge recombination.

A detector 400 collects the secondary electrons 250 emitted to the outside of the contact hole 145. Detector 400 is provided above the surface of wafer 110, separated from the area scanned by primary electrons 210 (contact hole 145) by a suitable distance. A photo multiply tube (PMT) or a Faraday cup may be used as detector 400, for example. The amount of the secondary electrons 250 collected by the detector 400 is relatively smaller than the amount of the generated secondary electrons 250. This is due to the amount of the secondary electrons 250 consumed by trapping or charge recombination. The amount of the consumed secondary electrons 250 is proportionate to the amount of the ions 151 accumulated at the bottom of the contact hole 145.

Therefore, when a large amount of the ions 151 are accumulated, since the probability of the secondary electrons 250 being trapped or of charge recombination occurring increases, the amount of the secondary electrons 250 collected and detected by the detector 400 is reduced. Meanwhile, when a small amount of the ions 151 are accumulated, the amount of the detected secondary electrons 250 is relatively large. Therefore, it is possible to determine the degree of charge-up induced in the resultant structure by the plasma used for the plasma process, or to quantize the degree of charge-up to a relative value, by comparing the amount of the secondary electrons 250 detected when a large amount of ions are accumulated to the amount of the secondary electrons 250 detected when a small amount of ions are accumulated, or by comparing the amount of the secondary electrons 250 detected from a discharged resultant structure when a large amount of ions are accumulated to the amount of the secondary electrons 250 detected from the discharged resultant structure when a small amount of ions are accumulated.

To be more specific, the amount of the secondary electrons 250 collected by the detector 400 can be shown as brightness with respect to the number of scans of the primary electrons 210. For example, the number of scans of the beam of the primary electrons 210 is provided by the electron beam generator 310. The detector 400 converts the amount of the collected secondary electrons 250 into a brightness or current value to be displayed by a determination unit 500. Also, the value related to the amount of the collected secondary electrons 250 can be displayed by the determination unit 500 as a value synchronized with the number of scans.

For example, the determination unit 500 can be microprocessor based and may be configured to display the change in the amount of the secondary electrons 250 with respect to the number of scans in the form of a graph, where the number of scans is shown on the X axis and the brightness is shown on the Y axis. Namely, the change in the amount of the detected secondary electrons 250 is shown as a graph of brightness vs number of scans, as shown in FIG. 3. The waveform of the graph shows a maximum peak point with respect to a certain number of scans.

It is possible to know the degree of charge-up induced by the plasma process on the basis of the maximum peak point of the waveform or the shape of the entire graph. For example, since the number of scans corresponding to the maximum peak point is related to the degree to which the ions 151 are charged up, it is possible to know the degree of charge-up by comparing the number of scans with each other.

Namely, when the degree to which the ions 151 are charged up is severe, more scans must be performed in order to reach the maximum peak point. Therefore, the number of scans corresponding to the maximum peak point increases. It is possible to determine charge-up or to quantize charge-up to a relative value by comparing the waveform of a sample graph to the waveform of a reference graph obtained from a sample in a standard state, for example, a discharged sample.

Now, a method of determining charge-up, or quantizing and measuring the degree of charge-up based on the above description, where the amount of the detected secondary electrons 250 is changed by the influence of charged ions induced by the plasma, will be described in detail as follows.

Figure 4:
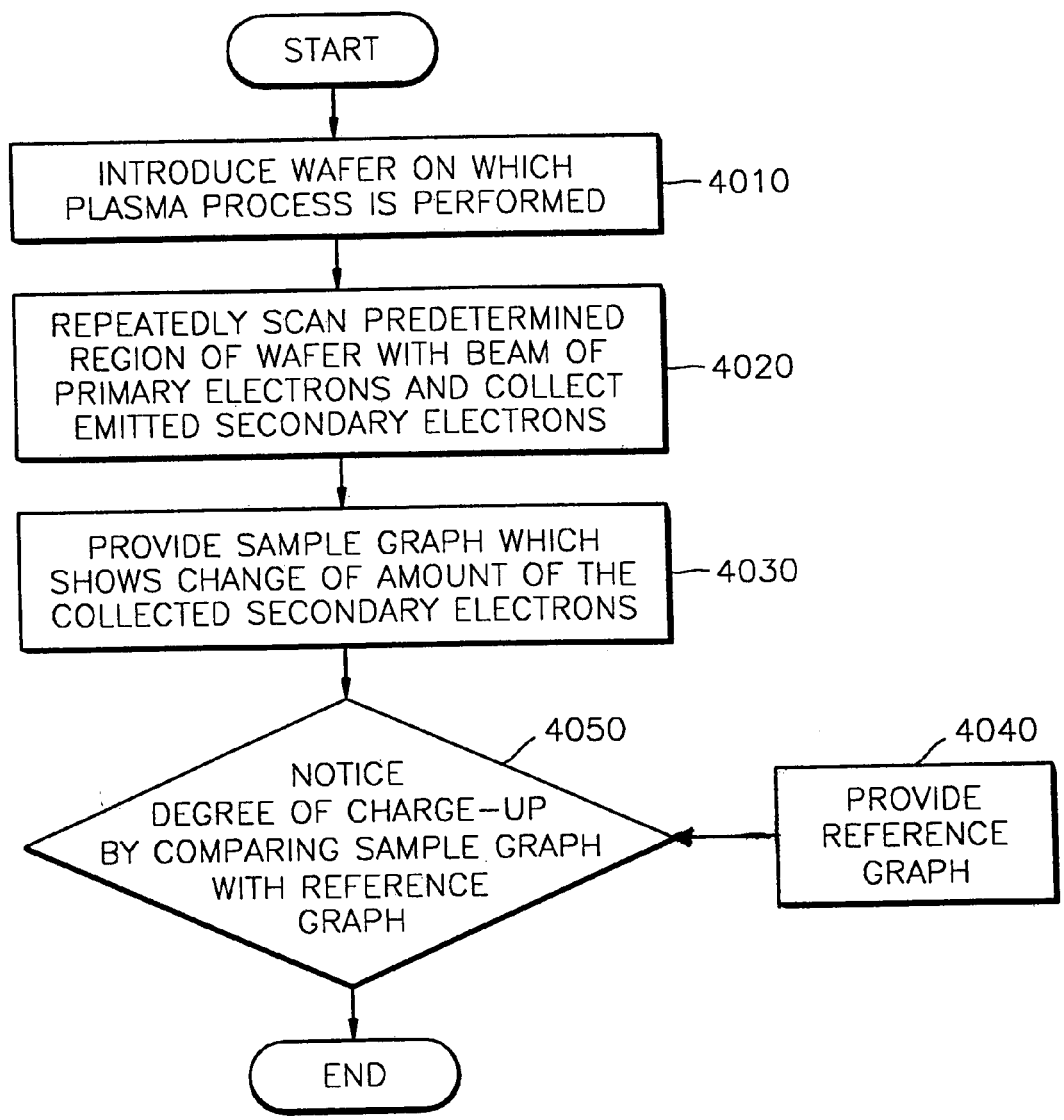
FIG. 4 is a flowchart for illustrating the degree of charge-up induced by plasma according to a second embodiment of the present invention.

FIG. 4 is a flowchart showing the processes of a method for determining the degree of charge-up induced by the plasma. To be specific, the wafer on which the plasma process has been performed is repeatedly scanned by the beam of primary electrons as described with reference to FIG. 2 and the scanned wafer is introduced to an apparatus for detecting emitted secondary electrons (step 4010). For example, the wafer 110 on which the contact hole 145 exposing the gate electrode 130 is formed by etching the insulating layer which covers the gate electrode 130 using plasma as the etching medium, and wherein the gate insulating layer 120 is disposed under gate electrode 130 as shown in FIG. 2, is introduced or provided.

Then, a predetermined region of the surface of the wafer 110 is repeatedly scanned with the beam of the primary electrons 210. For example, the inside of the contact hole 145 is repeatedly scanned. At this time, the secondary electrons 250 are generated by the reaction between the scanned primary electrons 210 and the surface of the wafer 110, for example the surface of the gate electrode 130 exposed by the contact hole 145, and secondary electrons 250 that are emitted are collected by the detector 400 (step 4020).

The change in the amount of the collected secondary electrons 250 is shown by determination unit 500 as corresponding to the number of scans of the primary electrons 210 (step 4030). For example, the sample graph where the change in the amount of the secondary electrons 250 according to the number of scans is displayed as a value such as the brightness of the secondary electrons 250, is provided as shown in FIG. 3.

In order to compare or analyze the sample graph, a reference graph is provided in a separate step (step 4040). A graph of secondary electrons, which are generated by repeatedly scanning primary electrons and that, are collected, are shown in the standard state to be used as the reference graph. The standard state means a state where there is no charge-up, that is, the sample is discharged.

The degree of charge-up is determined or quantized by comparing the sample graph to the reference graph (step 4050). For example, the degree to which charge-up is induced is determined or quantized by determination unit 500 by comparing the number of scans corresponding to the maximum peak point of the sample graph or the change in the amount of secondary electrons to the number of scans as previously set in the reference graph. For example, detector 400 collects the secondary electrons and produces a voltage signal. Determination unit 500 collects brightness information from detector 400 in response to scan pulses by electron beam generator 310. Then, determination unit 500 compares the measured brightness and the number of scans at the peak of the sample with respect to the saved reference (or critical) brightness and number of scans at peak values, whereby the numerical differentiation and integration method are used to determine the peak value. It is thus possible to know the degree of charge-up in the sample graph and the reference graph by comparing the waveform of the reference graph to the waveform of the sample graph.

The above embodiments can be supported by the following experimental results.

EXPERIMENTAL EXAMPLE 1

Figure 5:
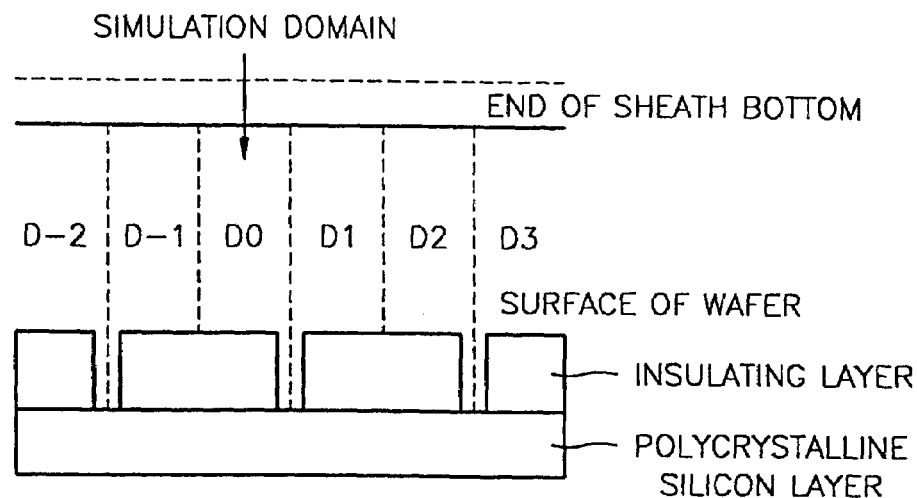
FIG. 5 shows the structure of a section of a pattern used for the Monte-Carlo simulation.

The traces of the primary and secondary electrons are obtained through the Monte-Carlo simulation in a structure where a contact hole formed by the plasma process exists. FIG. 5 shows the structure of the section of a pattern used for the Monte-Carlo simulation. In such a simulation, the structure of the section of a pattern shown in FIG. 5 is taken as an example.

Referring to FIG. 5, the region of a D0 domain marked with oblique lines is a basis. D-1, D-2, . . . which are left repetitive regions and D1, D2, . . . which are right repetitive regions are used for calculating the electric potential of the surface. In such a pattern geometry, since the critical dimension (CD) of the contact hole is much smaller than the sizes of a plasma bulk and a sheath region, the influence of the shape of the structure on the plasma and the sheath is negligible. The bottom of the contact hole is a conductor such as a polycrystalline layer. The contact hole is formed by etching an insulating layer such as an oxide silicon layer by an RF sputter etching process.

Electron angular energy distribution (EAED) and ion angular energy distribution (IAED), which are generated by charge-up induced by the plasma, are calculated by the Monte-Carlo simulation and are input as input values. For example, the EAED and the IAED are calculated using a linear vibration sheath model under the assumption that plasma density is about $1\times10^{18}$ $m^{-3}$, ion weight is 40 atomic unit (a.u.), ion temperature is 0.025 eV, and there is no collision between ions and neutrons.

Figure 6:
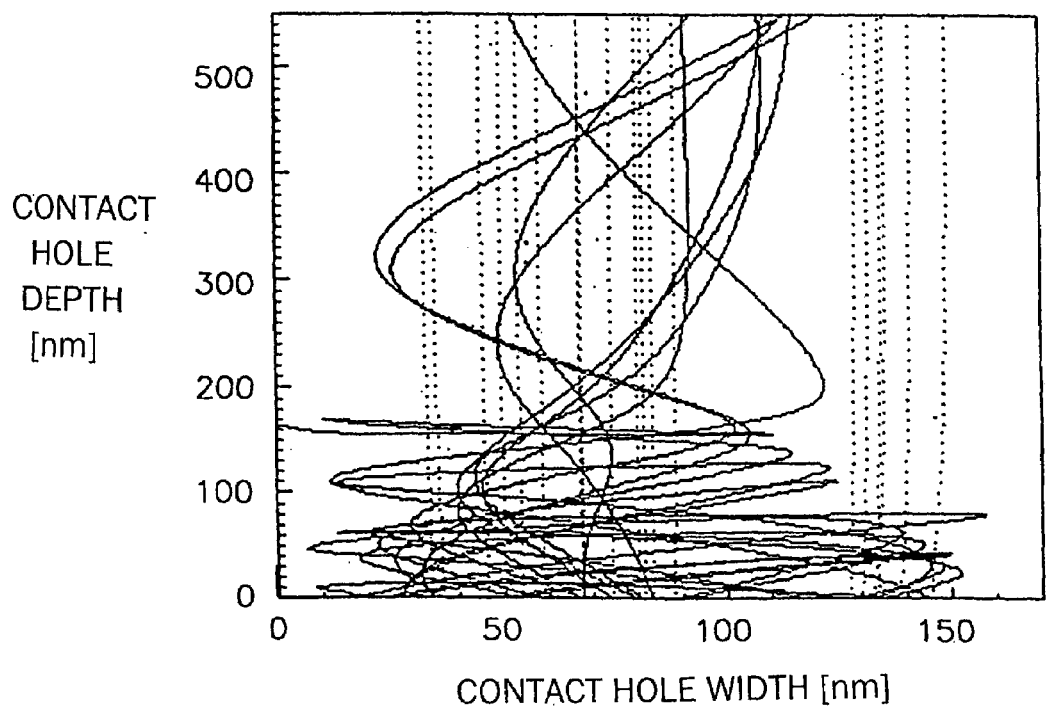
FIG. 6 shows the result of simulating the traces of primary and secondary electrons in a contact hole.

Primary electrons in the contact hole are scanned under the influence of charge separation or charge-up having the above conditions. It is assumed that primary electrons have a spatially cosine distribution. Primary electrons scattered at the upper portion of the contact hole reach the bottom of the contact hole according to an equation of motion. Secondary electrons corresponding to a secondary electron emission coefficient are generated by the impact of primary electrons, and secondary electrons accumulate on the side wall of the contact hole or go out of the contact hole. The result of simulating the traces of the primary and secondary electrons is shown in FIG. 6, wherein the horizontal axis indicates line width at the bottom of the contact hole and the vertical axis indicates depth of the contact hole side wall. To be specific, the traces of primary electrons which perform scanning once are shown as dotted lines in FIG. 6. Here, the number (or amount) of primary electrons which perform scanning once is set to be 200. The traces of secondary electrons are shown as solid lines in FIG. 6.

Referring to FIG. 6, primary electrons have energy of about several hundred eV. Therefore, the change in the traces are hardly shown. Meanwhile, since secondary electrons have a low energy of no more than 50 eV, secondary electrons are affected by charge-up of secondary electrons accumulated on the side wall of the contact hole, thus traveling in a twisted motion. Namely, electrons can only go out of the contact hole through a very narrow window due to charge-up of secondary electrons on the side wall. Remaining secondary electrons are reflected again and accumulate at the bottom of the contact hole.

Figure 7:
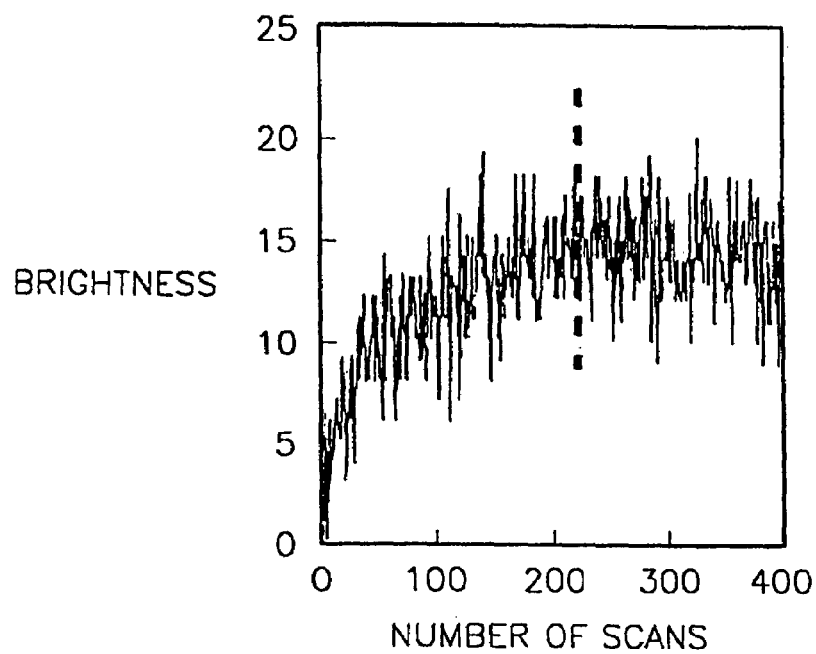
FIG. 7 shows the result of calculating by simulation the changes in brightness according to the number of scans in the case where charges generated by the plasma process accumulate at the bottom of the contact hole.
Figure 8:
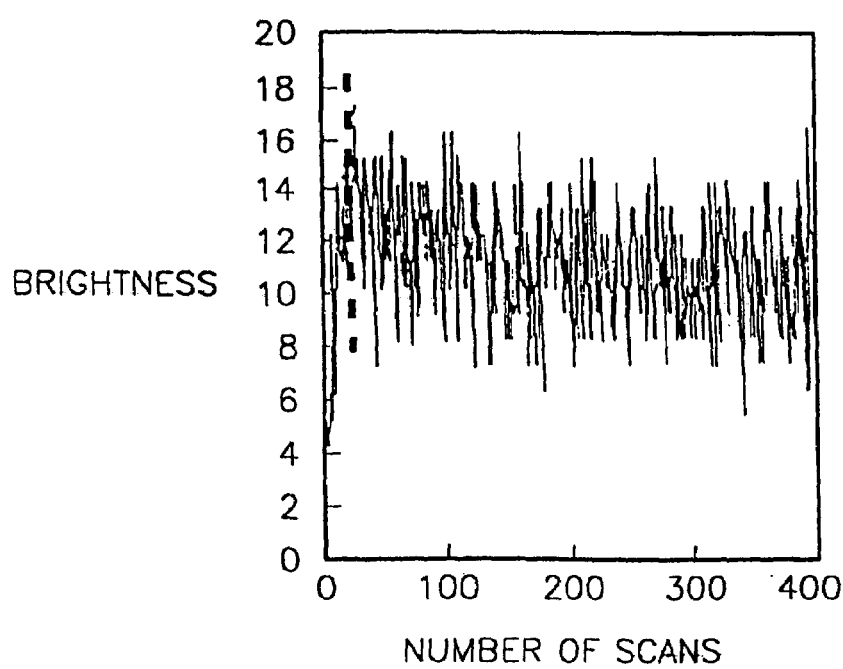
FIG. 8 shows the result of calculating by simulation the changes in brightness according to the number of scans in the case where charges are not accumulated at the bottom of the contact hole.

The number of secondary electrons which go out of the contact hole can vary according to the change in the environment inside the contact hole, in particular, the change in the distribution of charges. The change in the number (or amount) of secondary electrons with respect to the number of scans of the beam of primary electrons is shown in FIGS. 7 and 8. FIG. 7 shows the result of calculating by simulation the brightness with respect to the number of scans in the case where charges accumulate at the bottom of the contact hole. FIG. 8 shows the result of calculating by simulation the brightness according to the number of scans in the case where charges are not accumulated at the bottom of the contact hole.

To be specific, the bottom line width of the contact hole of 150 nm and the depth of the side wall formed of the insulating layer pattern of 50 nm are set, and the amount of detected secondary electrons with respect to the number of scans of primary electrons is shown by simulation as the brightness. It is noted that the waveform in the case where charges are accumulated, that is, charges are charged up, is different from the waveform in the case of where charges are not charged up. In particular, the number of scans corresponding to the maximum peak point marked with the dotted line in FIG. 7 is different from the number of scans corresponding to the maximum peak point marked with the dotted line in FIG. 8. In the case of FIG. 7 where charges are charged up, the number of scans corresponding to the peak point, that is the number of delayed scans, is about 200. Meanwhile, in the case of FIG. 8 where charges are not charged up, the number of delayed scans is about 10. Namely, the number of delayed scans in the case where charges are charged up is significantly different from the number of delayed scans in the case where charges are not charged up. It is possible to determine the degree of charge-up in the contact hole by comparison of the number of delayed scans.

The change in brightness with respect to the number of scans is measured with respect to real samples on the basis of the simulation result of Experimental Example 1.

EXPERIMENTAL EXAMPLE 2

Figure 9:
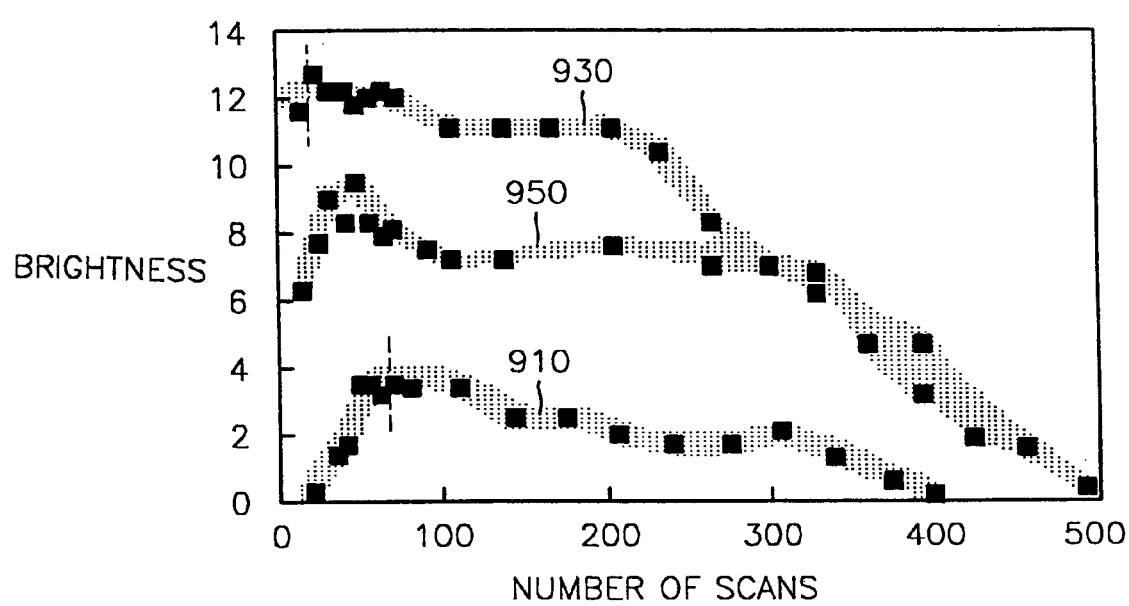
FIG. 9 shows changes in brightness detected according to the number of scans of the primary electron beam.

The center of the contact hole which exposes the gate electrode is scanned by primary electrons. The contact hole is repeatedly scanned by the beam of primary electrons and the amount of secondary electrons detected through the detector is displayed as the brightness. FIG. 9 shows the detected brightness according to the number of scans of the beam of primary electrons.

In FIG. 9, the brightness detected after forming the contact hole which exposes the gate electrode using Ar plasma is denoted by reference numeral 910. In this case, charge separation occurs in the contact hole formed by the Ar plasma. Accordingly, charge-up occurs in the contact hole. The brightness detected after forming the contract hole using Ar plasma, followed by an oxygen plasma process for the oxidation of the exposed gate electrode, is denoted by the reference numeral 930. In this case, since the gate electrode is formed of a double layer of polycrystalline silicon and tungsten silicide, an insulating layer of oxide silicon is formed on the gate electrode. Namely, in this case, the contact hole is not opened. The brightness of the case denoted by the reference numeral 910 is less than the brightness of the case denoted by the reference numeral 930, since the tungsten silicide layer under the insulating layer is consumed in the step of forming the contact hole. The brightness of the case denoted by the reference numeral 910 is reduced since the aspect ratio of the contact hole increases due to the consumption of the tungsten silicide layer.

The brightness detected after forming the contact hole using Ar plasma, followed by wet cleaning performed using SCI is denoted by reference numeral 950. In this case, charges which are charged up in the contact hole during Ar plasma process are discharged by the cleaning solution used for the wet cleaning. Therefore, reference numeral 950 denotes a case where the discharge is performed, and actually represents the reference graph in the standard state where there is no charge-up.

With further reference to FIG. 9, the waveforms of the graphs of the above three cases are different from each other. Therefore, it is noted that it is possible to determine whether charges are charged up by comparing the waveforms with each other. For example, the number of scans corresponding to the maximum peak point, that is the number of delayed scans of the waveform, denoted by the reference numeral 950 where there is no charge-up is smaller than that in the waveform denoted by reference numeral 910 where charge-up exists. This means it is possible to determine whether charge-up exists by comparing the number of delayed scans of the respective cases. Also, it is possible to determine the degree of charge-up, for example to what degree charge-up occurs with reference to the case where there is no charge-up, by comparing the number of delayed scans to each other. Namely, it is possible to quantize the degree of charge-up to a relative amount.

Alternatively, when the brightness of the maximum peak point, that is the maximum peak value, in the case denoted by the reference numeral 910 where charge-up exists (the sample graph) is compared with the maximum peak value in the case denoted by the reference numeral 950 where there is no charge-up (the reference graph), the former maximum peak value is much lower than the latter maximum peak value with respect to brightness. Therefore, it is possible to determine the relative degree of charge-up or the presence of charge-up, or to quantize the degree of charge-up to a relative value, by comparing the brightness of the maximum peak points to each other. The principle of determining the presence of charge-up, or determining the degree of charge-up, by the plasma can be applied to a method for determining whether the contact hole is opened, as an in-line process.

For example and with further reference to FIG. 9, the brightness of the waveform denoted by reference numeral 930 where the contact hole is not opened has a higher value than the brightness of the waveform denoted by reference numeral 950 where there is no charge-up and the contact hole is opened. Namely, the waveform denoted by reference numeral 930 corresponding to the sample graph is separated from the waveform denoted by the reference numeral 950 corresponding to the reference graph in toward the upper direction. In other words, in FIG. 9 the waveform denoted by reference numeral 930 is located above the waveform denoted by reference numeral 950. This is because the insulating layer in the case of the waveform denoted by reference numeral 930 forms the bottom of the contact hole when the contact hole is not opened. To be more specific, secondary electrons may be accumulated on the insulating layer which forms the bottom of the contact hole. Secondary electrons accumulated at the bottom of the contact hole repulse other secondary electrons from the bottom of the contact hole. Accordingly, secondary electrons accumulated at the bottom of the contact hole help to emit other secondary electrons out of the contact hole. Therefore, the amount of detected secondary electrons increases and the value of the brightness becomes higher as shown in the waveform of reference numeral 930.

Meanwhile, in the case denoted by the reference numeral 950 wherein the contact hole is opened, thus exposing the gate electrode under the contact hole, the bottom of the contact hole is formed of the surface of the gate electrode which is a conductor. Therefore, since secondary electrons which reach the surface of the gate electrode are conducted by the gate electrode and dispersed away, secondary electrons cannot be accumulated on the surface of the gate electrode. Therefore, secondary electrons which reach the bottom of the contact hole, that is the surface of the gate electrode, cannot help to emit other secondary electrons out of the contact hole as mentioned above. Therefore, it may be checked whether the waveforms are separated by overlapping the graphs obtained by the two cases. When the waveforms are separated, it is considered that the contact hole is not opened.

It is thus possible to determine whether the contact hole is opened by observing the change in the amount of secondary electrons emitted with respect to the number of scans of the beam of primary electrons by repeatedly scanning the inside of the contact hole with primary electrons and detecting emitted secondary electrons. For example, it is possible to determine whether the contact hole is opened by an in-line method or by additional measurement after performing the process of forming the contact hole by the plasma process.

EXPERIMENTAL EXAMPLE 3

Figure 10:
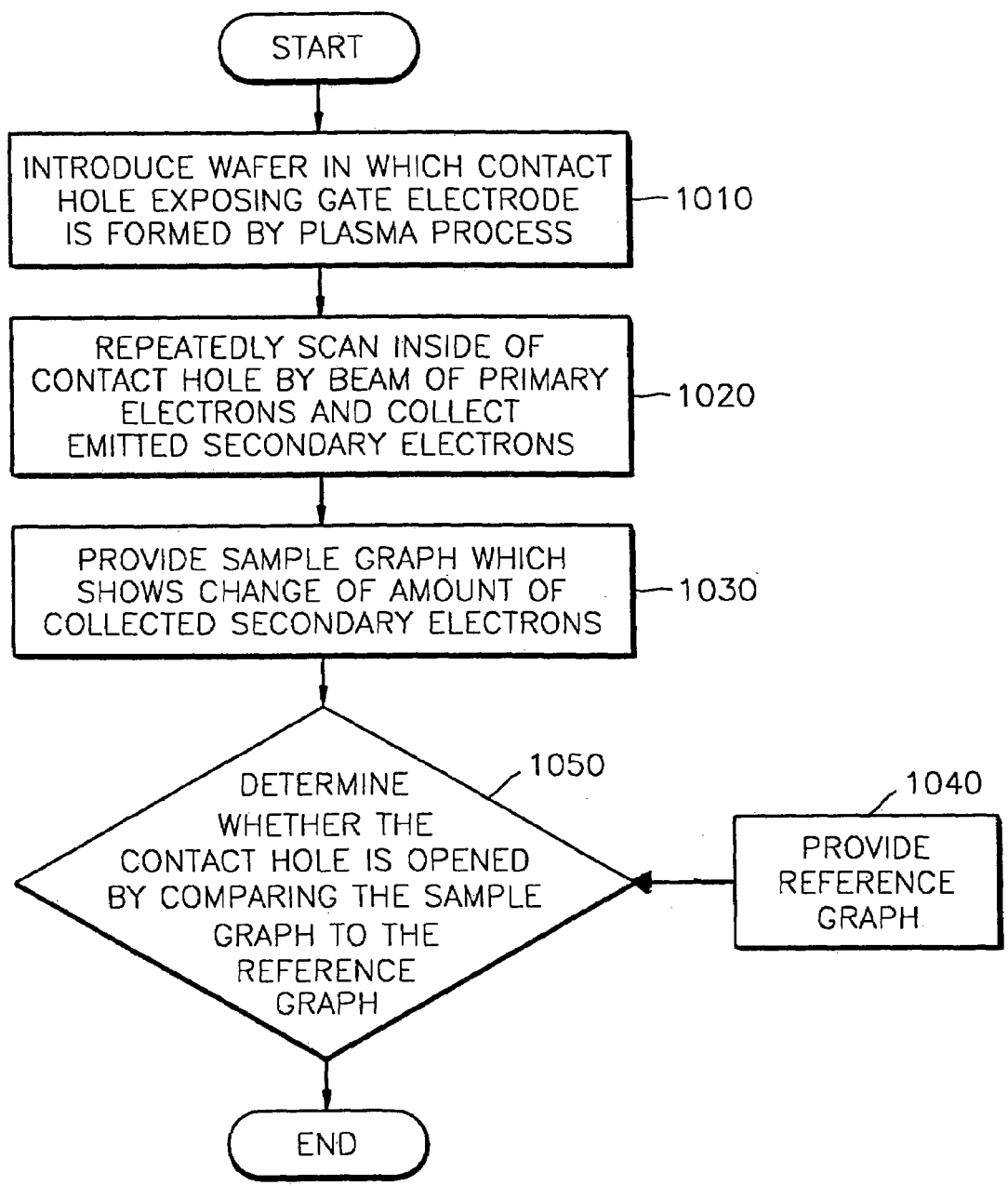
FIG. 10 is a flowchart for illustrating a method for determining whether the contact hole is open according to a third embodiment of the present invention.

FIG. 10 is a flowchart for illustrating a method for determining whether the contact hole is opened. To be specific, the wafer (110 of FIG. 2) on whose surface the contact hole (145 of FIG. 2) is formed by a plasma etching method is introduced (step 1010). At this time, the contact hole 145 exposes a conductive layer such as the gate electrode (130 of FIG. 2). The inside of the contact hole 145 is repeatedly scanned by the beam of the primary electrons (210 of FIG. 2) (step 1020). The beam of the primary electrons 210 incident on the inside of the contact hole 145 reacts with the bottom of the contact hole 145, thus generating the secondary electrons (250 of FIG. 2). The generated secondary electrons 250 are emitted to the outside of the contact hole 145. The emitted secondary electrons 250 are collected by the detector (400 of FIG. 2) (step 1030). The degree to which the collected secondary electrons 250 are emitted from the contact hole 145 varies according to whether the lower material layer such as the gate electrode (130 of FIG. 2) is exposed as mentioned with reference to FIG. 9.

Therefore, a sample graph is provided by showing the degree of brightness with respect to the change in the amount of the detected secondary electrons 250 with respect to the number of scans of the primary electrons 210 (step 1030). It is determined whether the contact hole 145 is opened by comparing the sample graph to the reference graph (1040) obtained in the standard state, for example, in the state where the contact hole is opened (step 1050).

Namely, since the reference graph which is the basis of determination shows a waveform of brightness with respect to the number of scans obtained in a state where the contact hole 145 is completely opened, it is possible to confirm whether the waveform of the sample graph is separated from the reference graph by overlaying the sample graph with the reference graph. When the waveform of the sample graph is separated from the reference graph, it can be considered that the contact hole 145 is not opened. Also, it is possible to consider that the contact hole 145 is opened when the waveform of the sample graph overlaps on the waveform of the reference graph.

Referring to FIG. 9, the waveform denoted by the reference numeral 930 corresponding to the sample graph is separated from the waveform denoted by the reference numeral 950 corresponding to the reference graph. From this, it is noted that the waveform denoted by the reference numeral 930 is obtained in a state where the contact hole 145 is not opened.

It is possible to determine whether the contact hole is opened by comparing the difference in brightness with respect to a certain number of scans. For example, the brightness of the waveform denoted by reference numeral 950 where the contact hole is opened as shown in FIG. 9 (the reference graph) has higher value than the brightness of the waveform denoted by the reference numeral 930 where the contact hole is not opened (the sample graph), with respect to no more than about 200 scans. Therefore, it can be considered that the contact hole is not opened when the peak value of the sample graph is higher than the peak value of the reference graph within the range of the above number of scans. Since the used reference number of scans varies according to the structural characteristic of the semiconductor device, the reference number must be defined for each semiconductor device.

The above method for determining whether the contact hole is opened provides a quantizable feature that may be more readily perceived than that provided by a conventional visual method for determining whether the contact hole is opened, such as by using an in-line scanning electron microscope (SEM). This is because it is possible to determine whether the contact hole is opened more accurately by the above method than by the visual means. Therefore, it is possible to prevent poor wiring connections in the following processes.

Referring to FIG. 9, the brightness of the waveforms is rapidly reduced as the number of scans increases. For example, the brightness begins to be rapidly reduced at about no less than 200 scans. This is due to degradation or breakdown of the gate insulating layer under the gate electrode. This will be described in more detail with reference to FIGS. 11 and 12.

Figure 11:
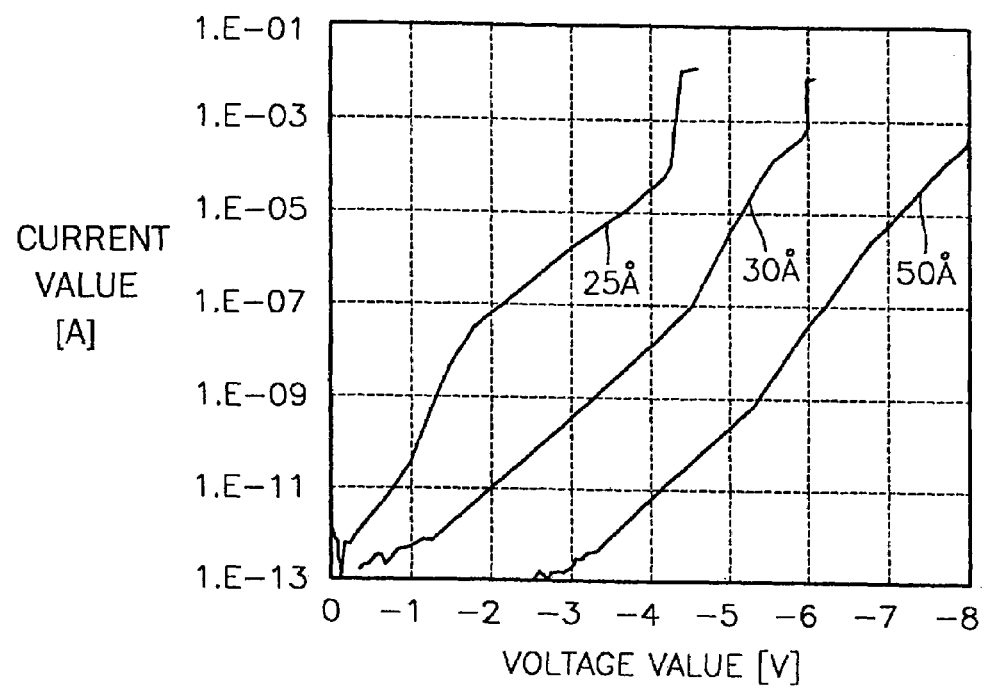
FIG. 11 shows the result of measuring leakage current in order to explain the leakage current generated in a gate insulating layer.

FIG. 11 shows the result of measuring leakage current which flows through the gate insulating layer. To be specific, when a negative voltage is applied to the gate insulating layer, the leakage current which flows through the gate insulating layer is measured. At this time, the leakage current is measured by a method for measuring stress induced leakage current (SILC). The leakage current is measured when the thickness of the gate insulating layer is 25, 30, and 50 Å. It is noted from FIG. 11 that the current leaks due to the breakdown under high stress, that is, when a negative voltage having a large value is applied.

Applying the negative voltage has the same effect as electrons being charged up when the beam of primary electrons scan the gate electrode in the embodiment of the present invention. Therefore, it can be considered that the negative voltage having the high value is applied when the number of scans of primary electrons increases. Therefore, it is assumed that the leakage current by the gate insulating layer or the breakdown of the gate insulating layer causes the brightness to be reduced as the number of scans increases.

Degradation of the gate insulating layer is one of the elements which affect the degree to which the gate insulating layer leaks. When the gate insulating layer is degraded, the current leakage occurs at a lower voltage than when the gate insulating layer is not degraded. Therefore, a correlation between the number of scans and the brightness when the gate insulating layer is degraded is different from the correlation between the number of scans and the brightness when the gate insulating layer is not degraded. Therefore, it is possible to determine or quantize the degree of degradation of the gate insulating layer using the correlation between the number of scans and the amount of secondary electrons, that is, the brightness.

Figure 12:
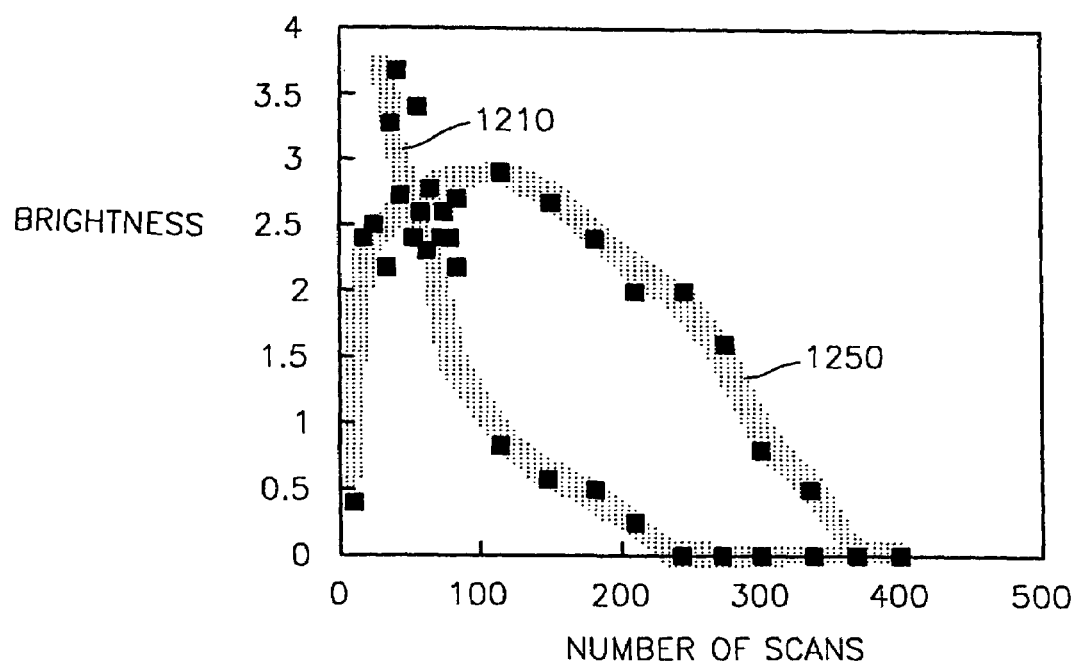
FIG. 12 is a graph showing the correlation between the number of scans and the brightness for samples having gate insulating layers with different degrees of degradation.

FIG. 12 is a graph showing the correlation between the number of scans and the brightness with respect to samples having gate insulating layers with different degrees of degradation. To be specific, two samples having different degrees of degradation of the gate insulating layers are provided. For example, samples where the gate electrodes are exposed can be provided by performing a process of forming the contact hole using the plasma as described in FIG. 9. The samples are repeatedly scanned by primary electrons and emitted secondary electrons are detected. As a result, it is possible to obtain different waveforms such as the waveform denoted by reference numeral 1210 and the waveform denoted by reference numeral 1250. The brightness of the waveform denoted by reference numeral 1210 is attenuated to 0 when the number of scans is smaller than the number of scans of the waveform denoted by reference numeral 1250. Meanwhile, the number of scans of the waveform denoted by the reference numeral 1250 is relatively large when the brightness becomes 0. Also, the brightness of the waveform denoted by reference numeral 1210 is rapidly reduced. Meanwhile, as mentioned with reference to FIG. 11, the reduction in brightness is significantly due to the current leakage. Also, the brightness of 0 indicates that the breakdown occurs and that the current leakage significantly occurs.

Therefore, it can be considered that the degree of current leakage or the breakdown is more severe in the sample which shows the waveform denoted by reference numeral 1210 than in the sample which shows the waveform denoted by reference numeral 1250. This means that the gate insulating layer is degraded by the plasma process used for forming the contact hole of a previous step in the case of the sample which shows the waveform denoted by reference numeral 1210. The degree of degradation of the insulating layer is very severe in the case of the sample which produces the waveform denoted by reference numeral 1210.

When the plasma process is performed as a previous step process, the degree of degradation of the gate insulating layer by the plasma can be measured by repeatedly scanning the wafer with primary electrons and detecting secondary electrons. For example, the number of scans of the waveform denoted by reference numeral 1210 where the brightness becomes 0 is about 200. Meanwhile, the number of scans of the waveform denoted by reference numeral 1250 where the brightness becomes 0 is about 400. Therefore, degradation of the gate insulating layer of the sample which produces the waveform denoted by reference numeral 1250 is less than degradation of the gate insulating layer of the sample which shows the waveform denoted by reference numeral 1210.

EXPERIMENTAL EXAMPLE 4

It is possible to determine the degree of degradation of the gate insulating layer by repeatedly scanning the wafer with the beam of primary electrons and detecting emitted secondary electrons. For example, it is possible to determine the degree of degradation of the gate insulating layer by an in-line process using the processes shown in FIG. 13.

Figure 13:
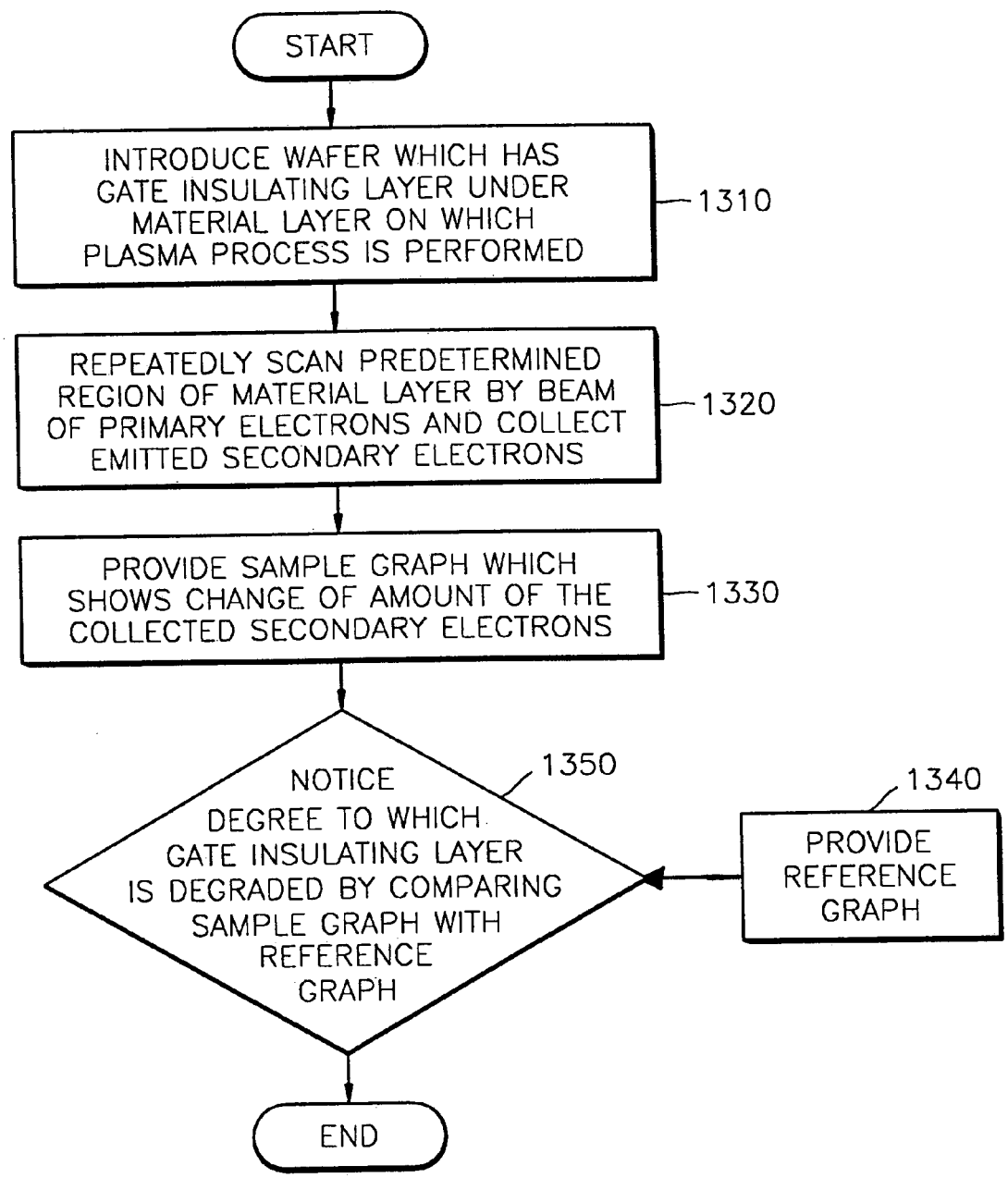
FIG. 13 is a flowchart for illustrating a method of determining the degree of degradation of the gate insulating layer according to a fourth embodiment of the present invention.

FIG. 13 is a flowchart for showing the processes of the method for determining the degree of degradation of the gate insulating layer. To be specific, a wafer which has a gate insulating layer under a material layer on which a plasma process is performed, is introduced (step 1310). For example, the wafer on which the insulating layer pattern (140 of FIG. 2) having the contact hole exposing the gate electrode (130 of FIG. 2) on the gate insulating layer (120 of FIG. 2) is introduced.

A certain region of a material layer, for example, the inside of the contact hole 145 is repeatedly scanned by the beam of the primary electrons (210 of FIG. 2) and the emitted secondary electrons (250 of FIG. 2) are collected by the detector (400 of FIG. 2) (step 1320). The collected secondary electrons 250 are emitted according to the degree of degradation of the gate insulating layer 120 by the plasma as mentioned with reference to FIG. 12. Therefore, the degree to which secondary electrons are detected varies according to the degree of degradation of the gate insulating layer 120 by the plasma. Therefore, the sample graph is provided by displaying the change in the amount of the collected secondary electrons 250 according to the number of scans (step 1330).

When charges are charged-up in the contact hole by the plasma process, the gate insulating layer 120 is affected by the charge-up as if an excessive amount of voltage were applied. Therefore, the gate insulating layer 120 may be degraded under the continuous influence of the above voltage. The degree of degradation is difficult to be sensed using an in-line process.

However, in the embodiment of the present invention, it is possible to measure the degree of degradation of the gate insulating layer 130 by showing the change in the amount of the detected secondary electrons as brightness with respect to the number of scans as shown in FIG. 12 and comparing the sample graph to the reference graph. Therefore, the graph of secondary electrons collected in the standard state where the gate insulating layer 130 is not degraded is provided as the reference graph (step 1340).

The degree of degradation of the gate insulating layer 130 is determined by comparing the reference graph to the sample graph (step 1350). For example, the waveform denoted by reference numeral 1250 of FIG. 12 can be considered as the waveform with respect to the gate insulating layer which is not degraded, that is the waveform of the reference graph, and the waveform denoted by reference numeral 1210 can be considered as the waveform with respect to the degraded gate insulating layer, that is the sample graph. Since the waveform of the sample graph 1210 is different from the reference graph 1250, this means that the sample graph 1210 shows a state where the gate insulating layer is degraded.

As mentioned above, it is possible to measure the degree of degradation of the gate insulating layer by a method of comparing the number of scans of the maximum peak points of brightness to each other, as well as by a method of comparing the entire waveform with the waveform in the standard state. The peak point is shown when the number of scans is no more than about 10 in the waveform denoted by reference numeral 1210. However, the peak point is shown when the number of scans is about 100 in the waveform denoted by reference numeral 1250. Therefore, it is possible to quantize the degree of degradation of the gate insulating layer by comparing the number of scans corresponding to the maximum peak point in the waveform denoted by reference numeral 1210 to the number of scans corresponding to the maximum peak point in the waveform denoted by reference numeral 1250 by performing about 100 scans. Namely, it can be considered that the sample graph where the maximum peak point corresponds to no more than 100 scans shows a state where the gate insulating layer is degraded. It is possible to determine the degree of degradation of the gate insulating layer by comparing the values of the brightness with respect to a certain number of scans.

It is possible to quantize the degree of degradation of the gate insulating layer by comparing the number of scans at the point in time where the brightness becomes 0. For example, in the waveform denoted by reference numeral 1210 of FIG. 12, the brightness becomes 0 when the number of scans is about 200. However, in the waveform denoted by reference numeral 1250, the brightness becomes 0 when the number of scans is about 400. Therefore, since the waveform denoted by reference numeral 1250 is a graph where the state of the gate insulating layer is good, that is the reference graph, it can be considered that the gate insulating layer is severely degraded when the brightness of the waveform of the sample graph is reduced to 0 when the number of scans is no more than about 400, in particular about 200.

Since the range of the number of scans or the standard state vary according to the structural characteristic of the semiconductor device, standards must be defined with respect to each semiconductor device. For example, the number of scans of the beam of primary electrons when degradation of the gate insulating layer or breakdown starts can be predicted as follows. For example, when the current density of electrons during scanning of the beam of primary electrons is referred to as $J_e(A/cm^2)$, the total amount of electrons charged-up on the bottom of the contact hole can be calculated as $Q=J_e \cdot \pi \cdot a^2 \cdot t1 \cdot N \cdot (1-c)$. The symbol a is the radius of the bottom of the contact hole, c is a secondary electron emission coefficient, N is the number of scans and t1 is the time for which the scans are performed.

The electric field where a specific oxide layer (for example, a silicon dioxide layer) begins to be degraded is about 16 MV/cm, which is $5.44 \times 10^{-6}$ C/cm$^2$ when expressed as the charge density. When $J_e$ is about 35 A/cm$^2$ and t1 is about 10 nsec, c is about 0.9. Therefore, the number of scans where the gate insulating layer begins to be degraded is about 155. Therefore, when this is applied to the result of FIG. 12, since the waveform denoted by reference numeral 1210 shows that degradation begins when the number of scans is no more than 100, it is noted that the gate insulating layer is severely degraded and the quality thereof is very poor.

Also, it is possible to calculate the amount of charged-up ions by the above equation when the number of scans corresponding to the peak point of the brightness, that is the delayed time $\tau$, is known. Namely, it is possible to calculate the amount of charged-up ions by $J_e \cdot \pi \cdot a2 \cdot \tau \cdot (1-c)$. Here, $\tau$ is defined as the total delayed scan time of primary electrons between the peak brightness of the sample and the reference (no change case), i.e. $\tau=(N2-N1)t1$. At this time, t1 must be small enough to measure τ. The time between scans t2 must be large enough to measure secondary electrons and small enough to discharge charged electrons. It is thus possible to quantize the amount of charged-up ions or the degree of degradation of the gate insulating layer by the above method.

According to the embodiments of the present invention, it is possible to determine the degree of charge-up induced to the processed patterns by repeatedly scanning the wafer with the beam of primary electrons and measuring the change in the amount of emitted secondary electrons. Also, it is possible to determine whether the contact hole is opened by measuring the change in the amount of emitted secondary electrons. It is possible to determine the degree to which the gate insulating layer is damaged and degraded by the plasma process. Accordingly, it is possible to secure reliability of the subsequent processes after the plasma process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of determining whether a conductive layer of a wafer is exposed through a contact hole that is formed in an overlying insulating layer by a plasma process, comprising:
    repeatedly scanning an inside of the contact hole with a beam of primary electrons;
    collecting secondary electrons that are generated by a reaction between the primary electron beam and an inside surface of the contact hole and that are emitted from the contact hole; and
    determining whether a surface of the conductive layer is exposed through the contact hole in the insulating layer pattern based on a change in an amount of collected secondary electrons,
    wherein said determining comprises,
        providing a sample graph which shows the change in the amount of collected secondary electrons with respect to a number of scans of primary electrons;
        providing a reference graph which shows a change in the amount of secondary electrons detected in a standard state where the conductive layer is exposed with respect to a number of scans of primary electrons; and
        determining whether the conductive layer is exposed by comparing a waveform of the sample graph to a waveform of the reference graph.

2. The method of claim 1, wherein the conductive layer is a gate electrode having a gate insulating layer thereunder.

3. The method of claim 1, wherein said repeatedly scanning comprises sequentially repeating transmission of the primary electron beam in a form of a pulse and counting a number of scans.

4. The method of claim 1, wherein said of determining whether the conductive layer is exposed by comparing comprises:
    designating the conductive layer as exposed when the waveform of the sample graph overlaps the waveform of the reference graph; and
    designating the conductive layer as not exposed when the waveform of the sample graph is separated from the waveform of the reference graph.

5. The method of claim 1, wherein said determining whether the conductive layer is exposed by comparing comprises designating the conductive layer as not exposed when the waveform of the sample graph is separated from the waveform of the reference graph in an upward direction when the number of scans of the primary electron beam is no more than 200.

6. A method of determining whether a contact hole exposes a conductive layer formed in an overlying insulating layer of a semiconductor device, comprising:
    scanning an inside of the contact hole with a beam of primary electrons at least N times, where N is an integer greater than one;
    collecting secondary electrons that are generated by a reaction between the primary electron beam and an inside surface of the contact hole and that are emitted from the contact hole for each of the N scans; and
    determining whether a surface of the conductive layer is exposed through the contact hole in the insulating layer pattern based on a change in an amount of collected secondary electrons as a function of the N scans.

7. The method of claim 6, wherein said determining includes determining a scan number (X) among the N scans where a peak number of secondary electrons are collected, and comparing X to a reference value.

8. The method of claim 6, wherein said determining comprises:
    providing a sample graph which shows the change in the amount of collected secondary electrons with respect to a number of scans of primary electrons;
    providing a reference graph which shows a change in the amount of secondary electrons detected in a standard state where the conductive layer is exposed with respect to a number of scans of primary electrons; and
    determining whether the conductive layer is exposed by comparing a waveform of the sample graph to a waveform of the reference graph.

* * * * *